(12) United States Patent
Magno et al.

(10) Patent No.: US 7,541,222 B2
(45) Date of Patent: Jun. 2, 2009

(54) WIRE SWEEP RESISTANT SEMICONDUCTOR PACKAGE AND MANUFACTURING METHOD THEREFOR

(75) Inventors: Sheila Rima C. Magno, Singapore (SG); Byung Tai Do, Singapore (SG); Dennis Guillermo, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 291 days.

(21) Appl. No.: 11/530,802

(22) Filed: Sep. 11, 2006

(65) Prior Publication Data

US 2007/0063354 A1 Mar. 22, 2007

Related U.S. Application Data

(63) Continuation-in-part of application No. 10/934,835, filed on Sep. 2, 2004, now abandoned.

(51) Int. Cl.
*H01L 21/00* (2006.01)
*H01L 23/48* (2006.01)

(52) U.S. Cl. ............ 438/125; 438/126; 438/127; 438/617; 257/782; 257/784; 257/787; 257/790; 257/E23.024

(58) Field of Classification Search ............ None
See application file for complete search history.

(56) References Cited

U.S. PATENT DOCUMENTS

| 5,331,205 | A | | 7/1994 | Primeaux | |
|---|---|---|---|---|---|
| 5,561,329 | A | * | 10/1996 | Mine et al. | 257/788 |
| 5,863,810 | A | * | 1/1999 | Kaldenberg | 438/27 |
| 6,211,574 | B1 | * | 4/2001 | Tao et al. | 257/784 |
| 6,531,762 | B1 | * | 3/2003 | Liao et al. | 257/666 |
| 6,762,490 | B2 | * | 7/2004 | Suzuki | 257/692 |
| 6,955,949 | B2 | * | 10/2005 | Batish et al. | 438/125 |

\* cited by examiner

*Primary Examiner*—Alonzo Chambliss
(74) *Attorney, Agent, or Firm*—Mikio Ishimaru

(57) ABSTRACT

A method for manufacturing a wire sweep resistant semiconductor package provides a die attached to an interposer. The die is electrically connected to the interposer with conductive wires. A sealant is applied on the die at the conductive wires for preventing wire sweep and the sealant is free of contact with the interposer. The die, the interposer, the conductive wires, and the sealant are encapsulated in an encapsulant.

20 Claims, 5 Drawing Sheets

WIRE SWEEP RESISTANT SEMICONDUCTOR PACKAGE AND MANUFACTURING METHOD THEREFOR

CROSS-REFERENCE TO RELATED APPLICATION

This is a continuation-in-part of co-pending U.S. patent application Ser. No. 10/934,835 filed Sep. 2, 2004.

TECHNICAL FIELD

The present invention relates generally to integrated circuits, and more particularly to package structures for integrated circuits.

BACKGROUND ART

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips, commonly called dies, are usually made from a semiconductor material such as silicon or gallium arsenide. Photolithographic techniques are used to form the various semiconductor devices in multiple layers on the dies.

Dies are encapsulated in a molded plastic package that has connectors or leads on the exterior of the package that function as input/output terminals for the die inside the package. The package includes an interposer and a die mounted on the top surface of the interposer.

The interposer may be comprised of a flexible resin tape, a rigid fiber-glass/copper sheet laminate, a co-fired ceramic coupon, a flexible metal lead frame, a ball grid array substrate or other well-known types of interposers in the semiconductor industry, depending on the particular type of semiconductor package being used.

The die is conventionally mounted to the top surface of the interposer with, for example, a layer of an adhesive or an adhesive film, and then electrically connected to the interposer by a number of fine, conductive wires, typically gold (Au) or aluminum (Al), that electrically connect the die to the interposer. The wires are attached to the die at the bonding pads of the die, which are located around the periphery of the die.

After one or more dies are wire bonded to the interposer, the dies, the interposer, and conductive wires are encapsulated in a mold material, such as plastic or epoxy, or in a multi-part housing made of plastic, ceramic, or metal. The encapsulation protects the interposer, the fine conductive wires, and the die from physical, electrical, moisture, and/or chemical damage.

Because of their fineness, wire sweep of the fine conductive wires is a constant problem during the encapsulation of a semiconductor die. The high viscosity of the encapsulation material in its liquid state during the encapsulation process drags the wires along the flow path of the material, causing the wires to bend away from their original upright positions. Wire sweep poses a reliability risk to the functionality of the semiconductor device. Wires that are swept may come in contact with each other causing shorts in the device. Wires that are swept may also touch the surface of the semiconductor die, which would cause shorts between different components on the die. Therefore, it is always desirable to keep the wire sweep level to a minimum to protect the functional integrity of the semiconductor device.

Certain factors contribute to the overall difficulty in limiting the wire sweep. As stated previously, flowing molding material exerts a drag force on the wires. If this force exceeds the strength of the wires or of the bonds, then the wires will bend. Longer wires tend to bend more easily than shorter wires; therefore, it is desirable to keep the wire lengths as short as possible. However, it is not always possible to keep the wire lengths short.

Another factor that contributes to the difficulty of controlling wire sweep is the proximity of the wires to each other. The closer the wires are together, the harder it is to reduce the possibility of wires coming into contact with each other. Miniaturization of circuit patterns on semiconductor dies results in wires being located closer together. Moreover, die designers are putting more components on a single die to expand its functions. Expanded functionality of each die results in more wires. More wires and smaller die circuit geometry require that the wires be much closer together, making wire sweep control far more difficult.

Thus, a need still remains to effectively control wire sweep. In view of the ever-increasing need to save costs and improve efficiencies, it is more and more critical that answers be found to this problem.

Solutions to this problem have been long sought but prior developments have not taught or suggested any and thus, answers to these phenomena have eluded those skilled in the art.

DISCLOSURE OF THE INVENTION

The present invention provides a method for manufacturing a wire sweep resistant semiconductor package provides a die attached to an interposer. The die is electrically connected to the interposer with conductive wires. A sealant is applied on the die at the conductive wires for preventing wire sweep and the sealant is free of contact with the interposer. The die, the interposer, the conductive wires, and the sealant are encapsulated in an encapsulant.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
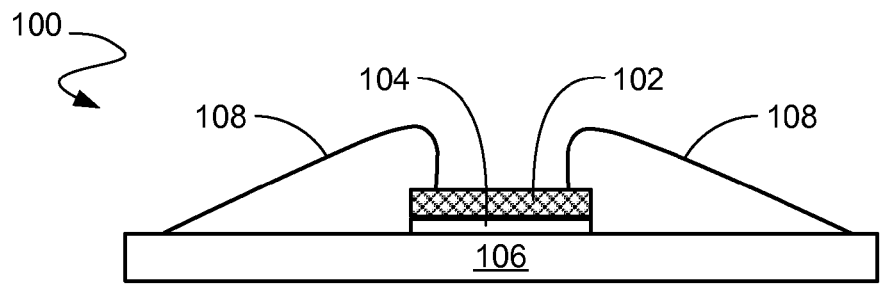
FIG. 1 is a side cross-sectional view of a wire sweep resistant semiconductor package in an intermediate stage of manufacture.

In the following description, numerous specific details are given to provide a thorough understanding of the invention. However, it will be apparent that the invention may be practiced without these specific details. In order to avoid obscuring the present invention, some well-known package configuration structural components and process steps are not disclosed in detail.

The drawings showing embodiments of the invention are semi-diagrammatic and not to scale and, particularly, some of the dimensions are for the clarity of presentation and are shown exaggerated in the FIGS. Also, where multiple embodiments are disclosed and described having some features in common, for clarity and ease of illustration, description, and comprehension thereof, like features one to another will ordinarily be described with like reference numerals. The embodiments are numbered as first, second, third, etc. merely as a matter of convenience and are not intended to limit the number of embodiments. Other embodiments will be obvious based on the present disclosure.

The term "horizontal" as used herein is defined as a plane parallel to the conventional plane or surface of a die, die paddle (or "pad"), or die package, regardless of its orientation. The term "vertical" refers to a direction perpendicular to the horizontal as just defined. Terms, such as "above", "below", "bottom", "top", "side" (as in "sidewall"), "higher", "lower", "over", and "under", are defined with respect to the horizontal plane. The term "on" means that one element is in contact with at least one other element.

The term "processing" as used herein includes deposition of material, patterning, exposure, development, etching, cleaning, and/or removal of the material as required in forming a described structure.

Referring now to FIG. 1, therein is shown a side cross-sectional view of a wire sweep resistant semiconductor package 100 in an intermediate stage of manufacture. A die 102 is attached by a die attach adhesive 104 to an interposer 106. The interposer 106 may be comprised of a flexible resin tape, a rigid fiber-glass/copper sheet laminate, a co-fired ceramic coupon, a flexible metal lead frame, a ball grid array substrate or other well-known types of interposers in the semiconductor industry, depending on the particular type of semiconductor package 100 being used.

The die 102 is then electrically connected to the interposer 106 by a number of fine, conductive wires 108, typically gold or aluminum. The fine, conductive wires 108 are wire bonded to the die 102 around the periphery of the die 102, typically with automated wire bonding equipment employing well-known thermal-compression or ultrasonic wire bonding techniques.

Because of their fineness, wire sweep of the fine, conductive wires 108 is a problem during the encapsulation of the die 102. During the encapsulation process, encapsulation materials in a high viscosity liquid state drag the fine, conductive wires 108 along the flow path of the material. This causes wire sweep, the bending of the fine, conductive wires 108 away from their original upright positions.

Wire sweep poses a reliability risk to the functionality of semiconductor devices. Wires that are swept may come in contact with each other causing short circuits in the device. Wires that are swept may also touch the surface of dies, which would cause short circuits between different components on the dies. Therefore, it is always desirable to keep the wire sweep level to a minimum to protect the functional integrity of dies.

Figure 2:
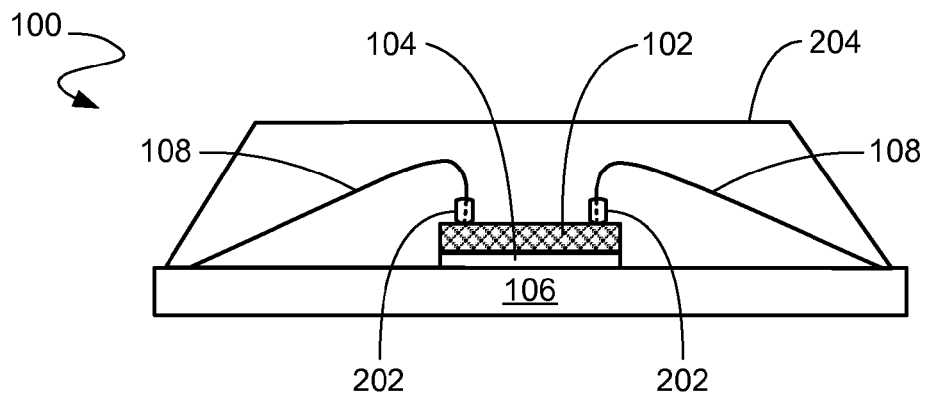
FIG. 2 is a cross-sectional view of the structure of FIG. 1 taken on cross sectional line 2-2 in FIG. 3 after application of a sealant and encapsulation in accordance with a first embodiment of the present invention.
Figure 3:
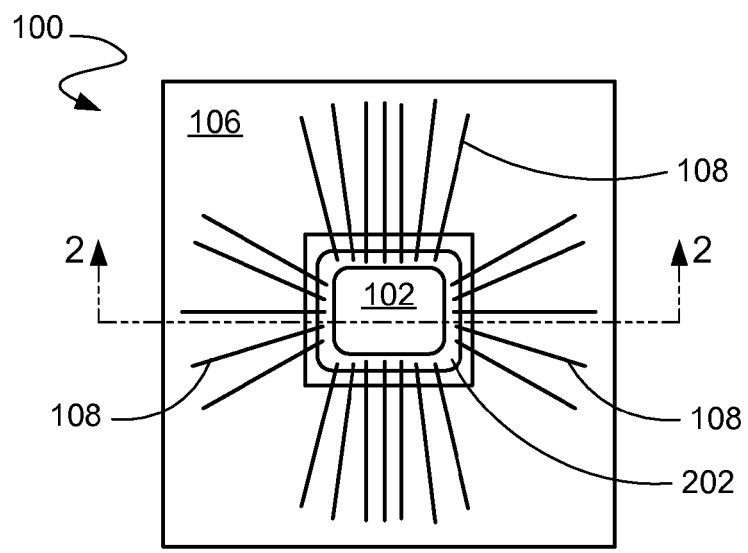
FIG. 3 is a top view of the structure of FIG. 2.

Referring now to FIG. 2, therein is shown a cross-sectional view of the structure of FIG. 1 taken on cross sectional line 2-2 in FIG. 3 after application of a sealant and encapsulation in accordance with a first embodiment of the present invention. A sealant 202, such as a liquid, gel, paste, or high thermal film, is applied directly on the die 102 at the wires 108, which is defined to be where the wires 108 are bonded to bond pads on the die 102. The sealant 202 prevents wire sweep of the wires 108 by securing the wires 108 at their bonded positions on the die 102 and holding the base of the wires 108 in fixed positions. These are near the highest points of the wires 108 and the most likely to be affected by the flow of encapsulant 204.

Referring now to FIG. 3, therein is shown a top view of the structure of FIG. 2 with the encapsulant 204 omitted for clarity of illustration. The sealant 202 is deposited directly on top of the die 102 and encloses the ends of the wires 108 where they are bonded to the die 102. However, the sealant 202 is in contact with the die 102 and free of contact with the interposer 106.

There are several advantages to the sealant 202 being free of contact with the interposer 106. One advantage is the reduction of problems associated with the risk of delamination. For example, it is easier to look for sealant material properties without considering adhesion requirements to the interposer 106. Another advantage is in the case of packages wherein the leadframe is used as the interposer 106. In this case, the leadframe is open from the die paddle area to the leadfinger area. Therefore, the only location possible to dispense the sealant 202 is on the wires 108. Yet another advantage is that a smaller volume of the sealant 202 is needed, thus making the process more economical.

Figure 4:
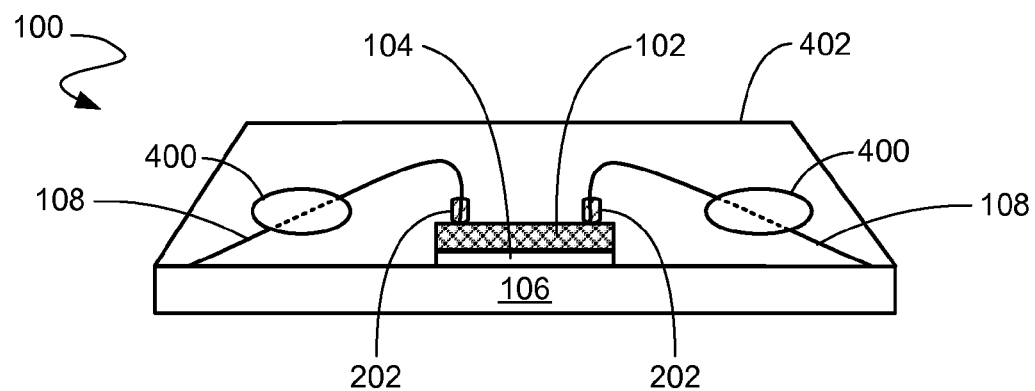
FIG. 4 is a cross-sectional view similar to FIG. 2 after application of sealants and encapsulation in accordance with a second embodiment of the present invention.

Referring now to FIG. 4, therein is shown a cross-sectional view similar to FIG. 2 after application of sealants and encapsulation in accordance with a second embodiment of the present invention. The die 102, the die attach adhesive 104, the interposer 106, the wires 108, and the sealant 202 have all been encapsulated through molding or glob top processes in an encapsulant 402. By securing the wires 108, the sealant 202 has prevented wire sweep.

To further prevent wire sweep, a further sealant 400, such as a liquid, gel, paste, or high thermal film, dispensed directly on the fine, conductive wires 108, is free of contact with the die 102 or the interposer 106. The further sealant 400 secures the fine, conductive wires 108 at any position along the length of the fine, conductive wires 108 or completely covering (not shown) the fine, conductive wires 108 free of contact with the die 102 and the interposer 106. The further sealant 400 prevents wire sweep of the wires 108 by securing the wires 108 in a fixed position. The die 102, the die attach adhesive 104, the interposer 106, the wires 108, and the sealant 400 are all then encapsulated in the encapsulant 402.

Figure 5:
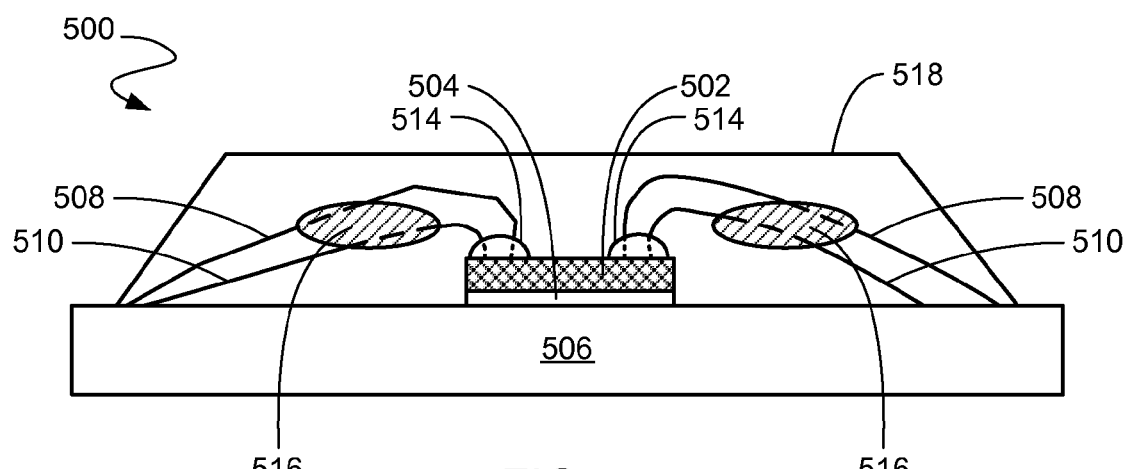
FIG. 5 is a cross-sectional view taken on cross sectional line 5-5 in FIG. 6 after application of a sealant and encapsulation of a double wire bond die in accordance with a third embodiment of the present invention.
Figure 6:
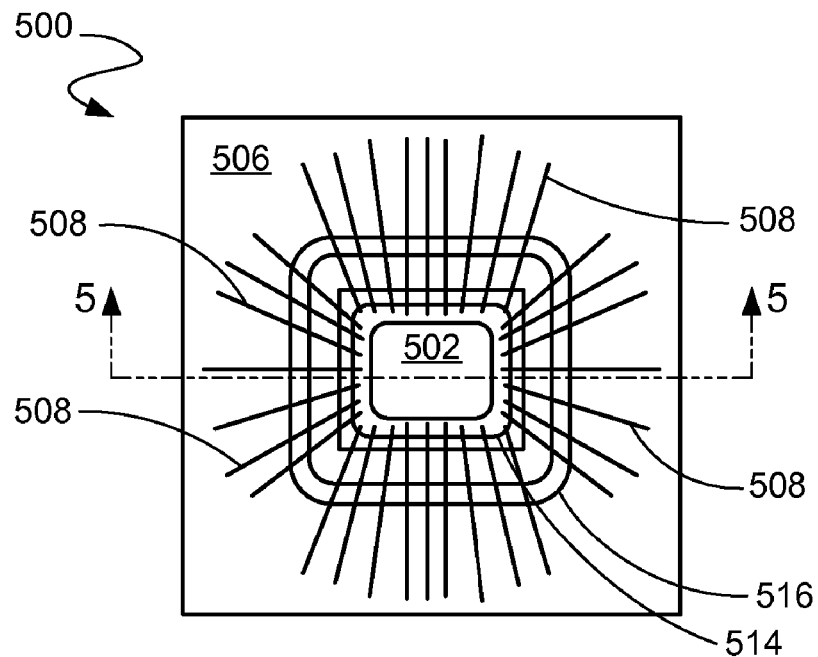
FIG. 6 is a top view of the structure of FIG. 5.

Referring now to FIG. 5, therein is shown a cross-sectional view taken on cross sectional line 5-5 in FIG. 6 after application of a sealant and encapsulation of a double wire bond sweep resistant die 500 in accordance with a third embodiment of the present invention. A die 502 is attached by a die attach adhesive 504 to an interposer 506. A number of fine, conductive wires 508 and 510 electrically connect the die 502 to the interposer 506.

A sealant 514, such as a liquid, gel, paste, or high thermal film, dispensed directly on the base of fine, conductive wires 508 and 510, is free of contact with the interposer 506. A single line of the sealant 514 or a series of droplets of the sealant 514 surround the base of individual, groups, or all of the fine, conductive wires 508 and 510.

A further sealant 516, such as a liquid, gel, paste, or high thermal film, dispensed directly on the fine, conductive wires 508 and 510, is free of contact with the die 502 or the interposer 506. The further sealant 516 secures the fine conductive wires 508 and 510 at any position along the length of the fine conductive wires 508 and 510 or completely covering (not shown) the fine conductive wires 508 and 510. The further sealant 516 prevents wire sweep of the wires 508 and 510 by securing the wires 508 and 510 in a fixed position. The die 502, the die attach adhesive 504, the interposer 506, the wires 508 and 510, and the sealant 516 are all then encapsulated in an encapsulant 518.

Referring now to FIG. 6, therein is shown a top view of the structure of FIG. 5 with the encapsulant 518 omitted for clarity of illustration. The sealant 514 and the further sealant 516 secure the fine conductive wires 508 and 510. Both the sealant 514 and the further sealant 516 are free of contact with the interposer 506.

Figure 7:
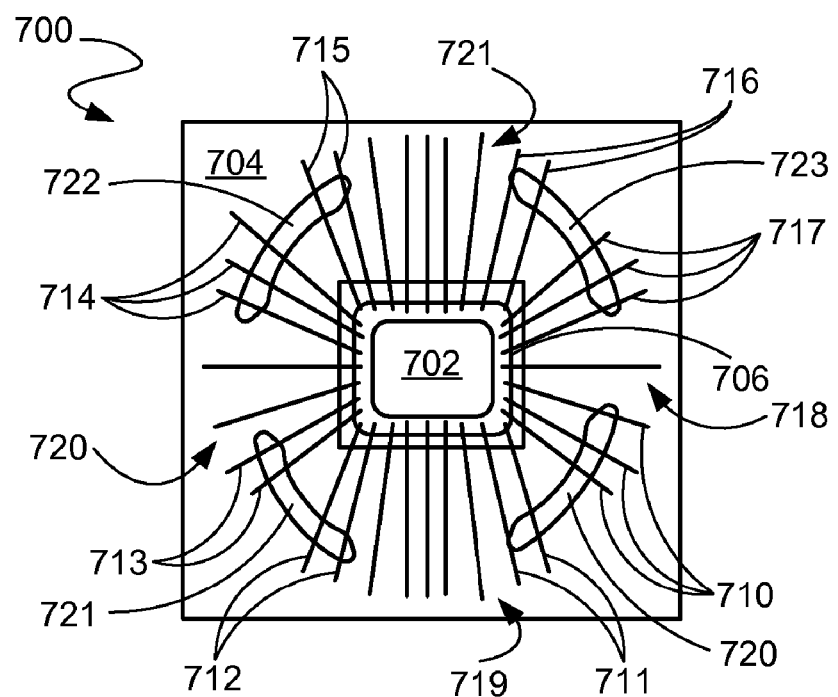
FIG. 7 is a top view similar to FIG. 6 after application of sealants and encapsulation in accordance a fourth embodiment with the present invention.

Referring now to FIG. 7, therein is shown a top view similar to FIG. 6 after application of sealants and encapsulation in accordance a fourth embodiment with the present invention. A sweep resistant package 700 is shown with an encapsulant omitted for clarity of illustration. A die 702 is attached by a die attach adhesive (not shown, but see the die attach adhesive 104 in FIG. 1) to an interposer 704.

A sealant 706 is deposited directly on top of the die 702 and encloses the ends of wires 708-721 where they are bonded to the die 702. A first discrete drop 720 of sealant secures a first distinct group of wires, the fine conductive wires 710 and 711. A second discrete drop 721 of sealant secures a second distinct group of wires, the fine conductive wires 712 and 713. A third discrete drop 722 of sealant secures a third distinct group of wires, the fine conductive wires 714 and 715. A fourth discrete drop 723 of a sealant secures a fourth distinct group of wires, the fine conductive wires 716 and 717.

The fine conductive wires 718-721 do not have to have sealant on them because they are in the flow direction of the encapsulant so as to be minimally affected or be far enough away from other wires to not be short-circuited even if they are affected by wire sweep. In addition, the sealant 706 will provide a first line of defense against wire sweep.

The same and different numbers of wires can be secured together by each of the discrete drops. The discrete drops do not have to be of uniform size, shape, or number nor do they have to be symmetrical.

Figure 8:
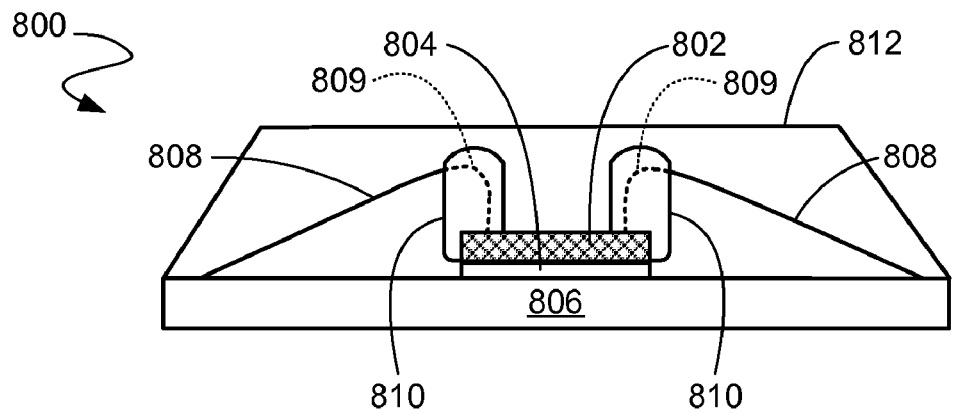
FIG. 8 is a cross-sectional view similar to FIG. 2 after application of sealants and encapsulation in accordance with a fifth embodiment of the present invention.

Referring now to FIG. 8, therein is shown a cross-sectional view similar to FIG. 2 after application of sealants and encapsulation in accordance with a fifth embodiment of the present invention. A sweep resistant semiconductor package 800 with a die 802 attached by a die attach adhesive 804 to an interposer 806. Fine, conductive wires 808 are secured by a sealant 810, which extends to encompass the wire loops 809 of the fine, conductive wires 808. The sealant 810 extends down the side of the die 802 but is free of contact with the interposer 806. The die 802, the die attach adhesive 804, the interposer 806, the wires 808, and the sealant 810 are all encapsulated in an encapsulant 812.

Figure 9:
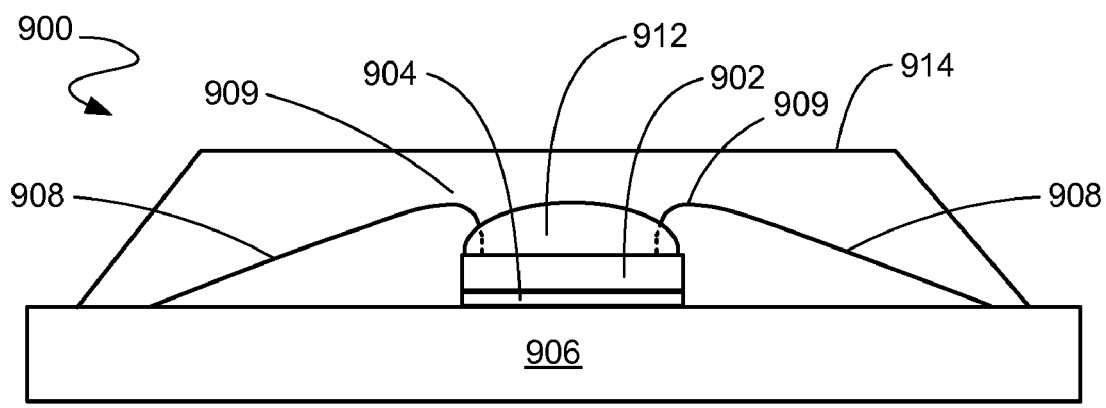
FIG. 9 is a cross-sectional view similar to FIG. 2 after application of sealants and encapsulation in accordance with a sixth embodiment of the present invention.

Referring now to FIG. 9, therein is shown a cross-sectional view similar to FIG. 2 after application of sealants and encapsulation in accordance with a sixth embodiment of the present invention. A die 902 is attached by an epoxy 904 to an interposer 906. A number of fine, conductive wires 908 electrically connect the die 902 to the interposer 906.

A sealant 912 secures the fine, conductive wires 908 by covering the entire or substantially the entire top of the die 902 and covering the fine, conductive wires 908 where they are bonded to the die 902 but without covering the wire loops 909. The sealant 912 does not contact the interposer 906 or the wire loops of the fine, conductive wires 908. The die 902, the die attach adhesive 904, the interposer 906, the fine conductive wires 908, and the sealant 912 are all encapsulated in an encapsulant 914.

Figure 10:
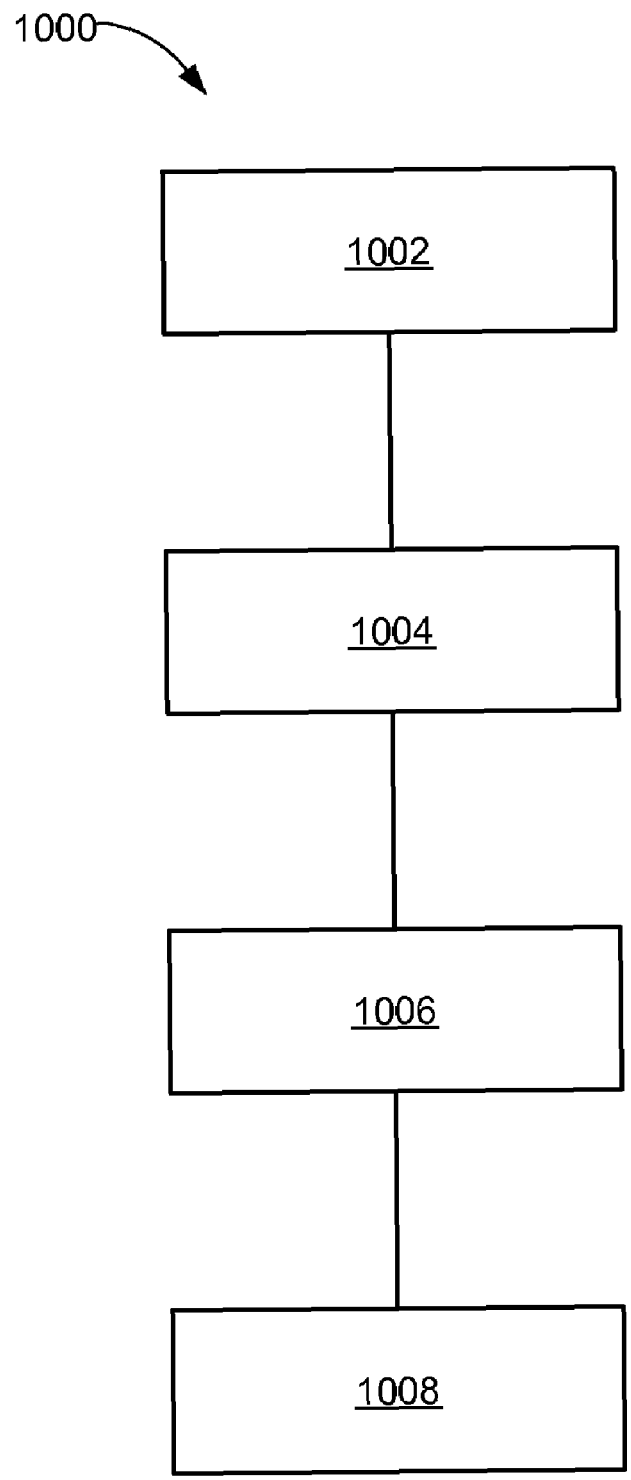
FIG. 10 is a flow chart of a method for manufacturing a wire sweep resistant semiconductor package in accordance with the present invention.

Referring now to FIG. 10, therein is shown a flow chart of a method 1000 for manufacturing a wire sweep resistant semiconductor package in accordance with an embodiment of the present invention. The method 1000 includes providing a die attached to an interposer in a block 1002; electrically connecting the die to the interposer with conductive wires in a block 1004; applying a sealant on the die at the conductive wires for preventing wire sweep, the sealant free of contact with the interposer in a block 1006; and encapsulating the die, the, interposer the conductive wires, and the sealant in an encapsulant in a block 1008.

Thus, it has been discovered that the wire sweep resistant method and apparatus of the present invention furnish important and heretofore unknown and unavailable solutions, capabilities, and functional advantages for preventing wire sweep. The resulting process and configurations are straightforward, economical, uncomplicated, highly versatile, accurate, sensitive, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing a wire sweep resistant semiconductor package, comprising:
   providing a die attached to an interposer;
   electrically connecting the die to the interposer with conductive wires;
   applying a sealant on first and second distinct groups of the conductive wires, separated by other conductive wires to which the sealant is not applied, for preventing wire sweep, the sealant free of contact with the interposer; and
   encapsulating the die, the interposer, the conductive wires, and the sealant in an encapsulant.

2. The method as claimed in claim 1 wherein applying the sealant on the conductive wires further comprises applying the sealant over the wire loops of the conductive wires.

3. The method as claimed in claim 1 wherein applying the sealant on the conductive wires further comprises covering substantially the entire top of the die.

4. The method as claimed in claim 1 further comprises applying further sealant on the one or more of the conductive wires free of contact with the die and the interposer.

5. The method as claimed in claim 1 further comprising electrically connecting the die to the interposer with a further row of conductive wires and applying further sealant on the conductive wires and the further row of conductive wires free of contact with the die and the interposer.

6. A method for manufacturing a wire sweep resistant semiconductor package, comprising:
providing a die attached to an interposer;
electrically connecting the die to the interposer with conductive wires;
applying a sealant on the die at and around the base of first and second distinct groups of the conductive wires, separated by other conductive wires to which the sealant is not applied, for preventing wire sweep, the sealant free of contact with the interposer; and
encapsulating the die, the interposer, the conductive wires, and the sealant in an encapsulant.

7. The method as claimed in claim 6 wherein applying the sealant on the conductive wires further comprises applying the sealant over the wire loops of the conductive wires and extending down the sides of the die.

8. The method as claimed in claim 6 wherein applying the sealant on the conductive wires further comprises covering the entire or substantially the entire top of the die without covering the wire loops of the conductive wires.

9. The method as claimed in claim 6 further comprises applying further sealant on the one or more of the conductive wires in groups, the further sealant free of contact with the die and the interposer.

10. The method as claimed in claim 6 further comprising electrically connecting the die to the interposer with a further row of conductive wires and applying further sealant on the conductive wires and the further row of conductive wires in groups, the further sealant free of contact with the die and the interposer.

11. A wire sweep resistant semiconductor package, comprising:
an interposer;
a die attached to the interposer, the die electrically connected to the interposer with conductive wires;
a sealant on first and second distinct groups of the conductive wires, separated by other conductive wires not having the sealant, for preventing wire sweep, the sealant free of contact with the interposer; and
an encapsulant for encapsulating the die, the interposer, the conductive wires, and the sealant.

12. The package as claimed in claim 11 wherein the sealant on the conductive wires further comprises the sealant over the wire loops of the conductive wires.

13. The package as claimed in claim 11 wherein the sealant on the conductive wires further comprises the sealant substantially covering the entire top of the die.

14. The package as claimed in claim 11 further comprises further sealant on the one or more of the conductive wires, the further sealant free of contact with the die and the interposer.

15. The package as claimed in claim 11 further comprising a further row of conductive wires electrically connecting the die to the interposer and further sealant on the conductive wires, the further sealant free of contact with the die and the interposer.

16. A wire sweep resistant semiconductor package, comprising:
an interposer;
a die attached to the interposer;
conductive wires for electrically connecting the die to the interposer;
a sealant on the die at and around the base of first and second distinct groups of the conductive wires, separated by other conductive wires not having the sealant, for preventing wire sweep, the sealant free of contact with the interposer; and
an encapsulant for encapsulating the die, the interposer, the conductive wires, and the sealant.

17. The package as claimed in claim 16 wherein the sealant on the conductive wires further comprises the sealant over the wire loops of the conductive wires and extending down the sides of the die.

18. The package as claimed in claim 16 wherein the sealant on the conductive wires further covers the entire or substantially the entire top of the die without covering the wire loops of the conductive wires.

19. The package as claimed in claim 16 further comprises further sealant on the one or more of the conductive wires in groups, the further sealant free of contact with the die and the interposer.

20. The package as claimed in claim 16 further comprising a further row of conductive wires for electrically connecting the die to the interposer and further sealant on the conductive wires and the further row of conductive wires in groups, the further sealant free of contact with the die and the interposer.

* * * * *